(12) United States Patent
Yang et al.

(10) Patent No.: US 8,614,127 B1
(45) Date of Patent: Dec. 24, 2013

(54) METHOD OF MAKING A FINFET DEVICE

(71) Applicant: Taiwan Semiconductor Manufacturing Company, Ltd., Hsin-Chu (TW)

(72) Inventors: Kai-Chieh Yang, Zhubei (TW); Wei-Hao Wu, Hsinchu (TW); Wen-Hsing Hsieh, Hsinchu (TW); Zhiqiang Wu, Chubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/744,932

(22) Filed: Jan. 18, 2013

(51) Int. Cl.
*H01L 21/338* (2006.01)
*H01L 21/336* (2006.01)
*H01L 21/3205* (2006.01)

(52) U.S. Cl.
USPC .... 438/270; 438/268; 438/589; 257/E21.429; 257/E21.628

(58) Field of Classification Search
None
See application file for complete search history.

(56) References Cited

U.S. PATENT DOCUMENTS 7,972,914 B2 * 7/2011 Kim et al. ..................... 438/173

* cited by examiner

*Primary Examiner* — Seahvosh Nikmanesh
(74) *Attorney, Agent, or Firm* — Haynes and Boone, LLP

(57) ABSTRACT

A FinFET device is fabricated by first receiving a FinFET precursor. The FinFET precursor includes a substrate, first fins on the substrate, isolation regions on sides of the first fins, source/drain features on the substrate and dummy gate stacks separating the source/drain features on the substrate. The dummy gate stack is removed to expose the first fins and then the first fins are recessed to form channel trenches. A channel layer is deposited in the channel trenches and then is recessed. Then the isolation regions are recessed to laterally expose at least a portion of the recessed channel layer to form second fins. A high-k (HK) dielectric layer and a metal gate (MG) layer are deposited on the second fins.

20 Claims, 9 Drawing Sheets

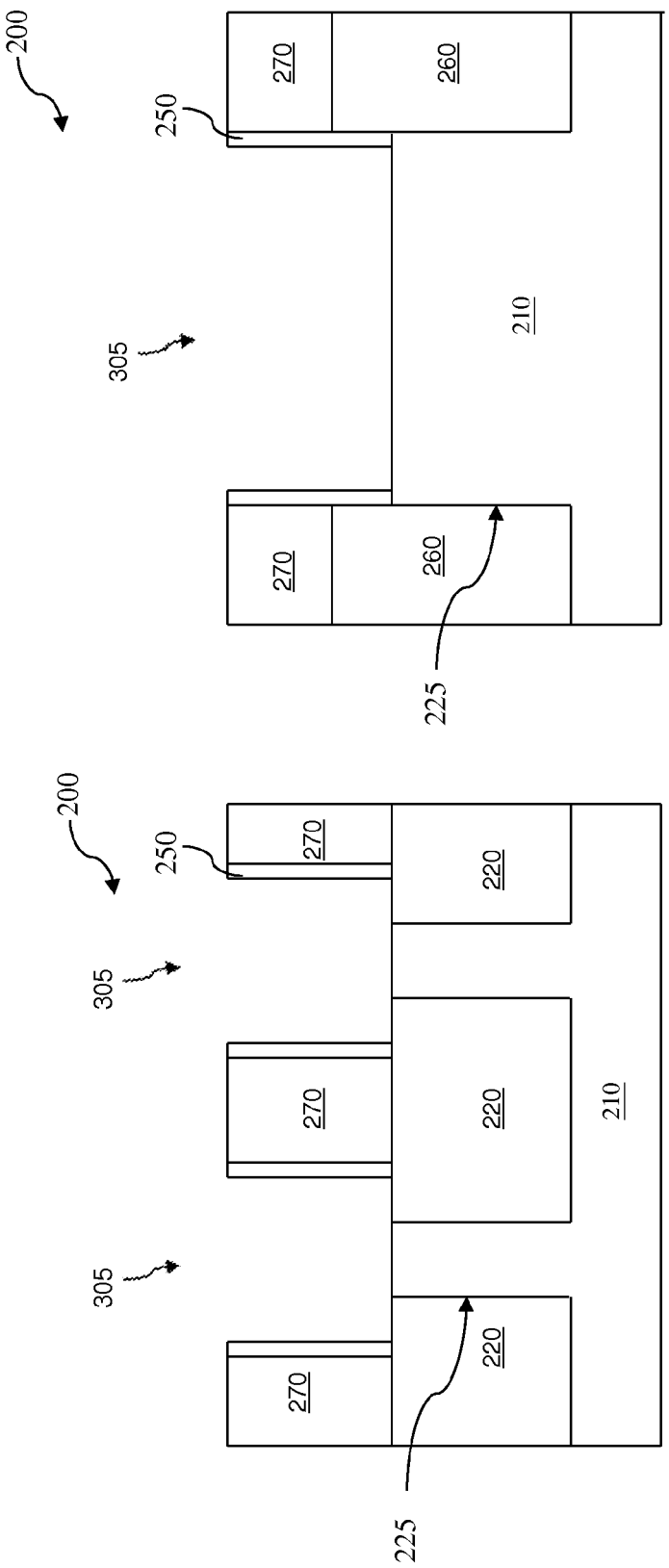

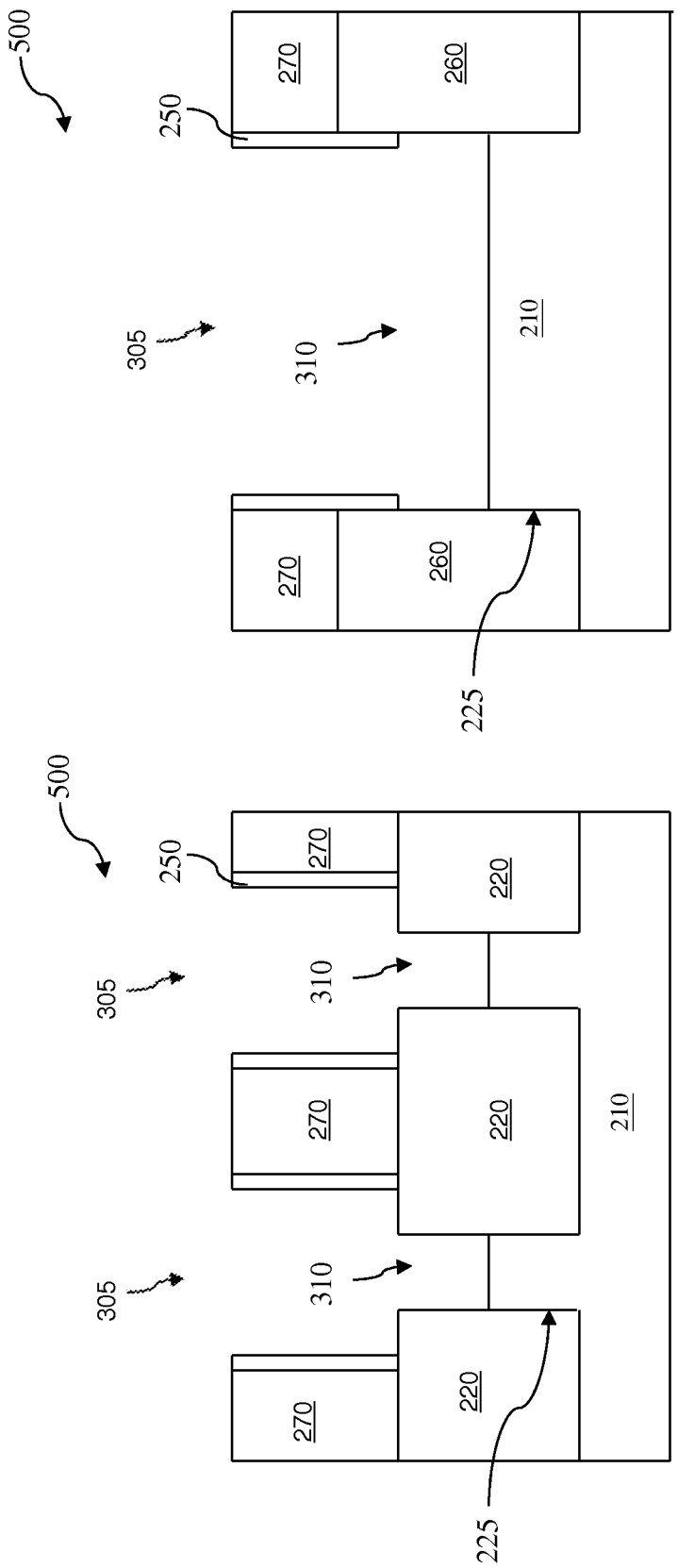

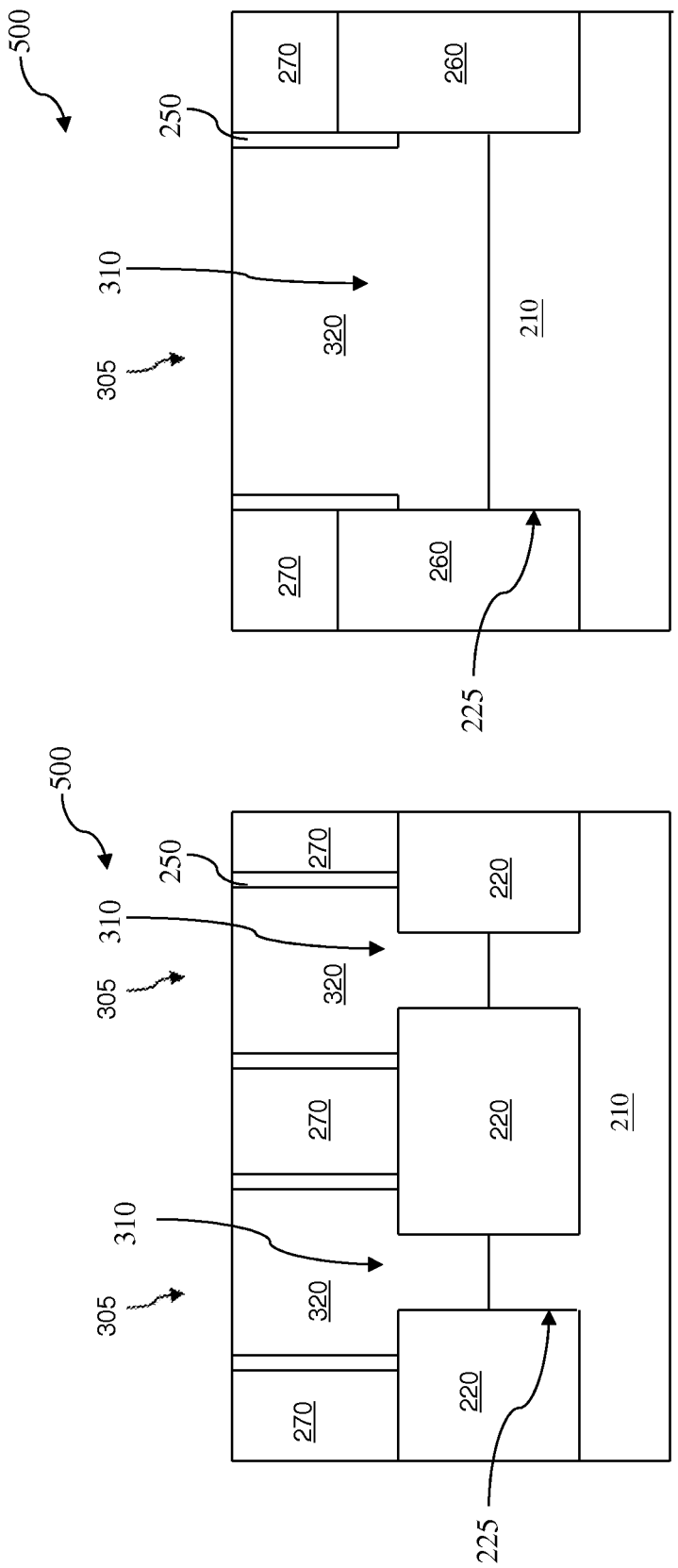

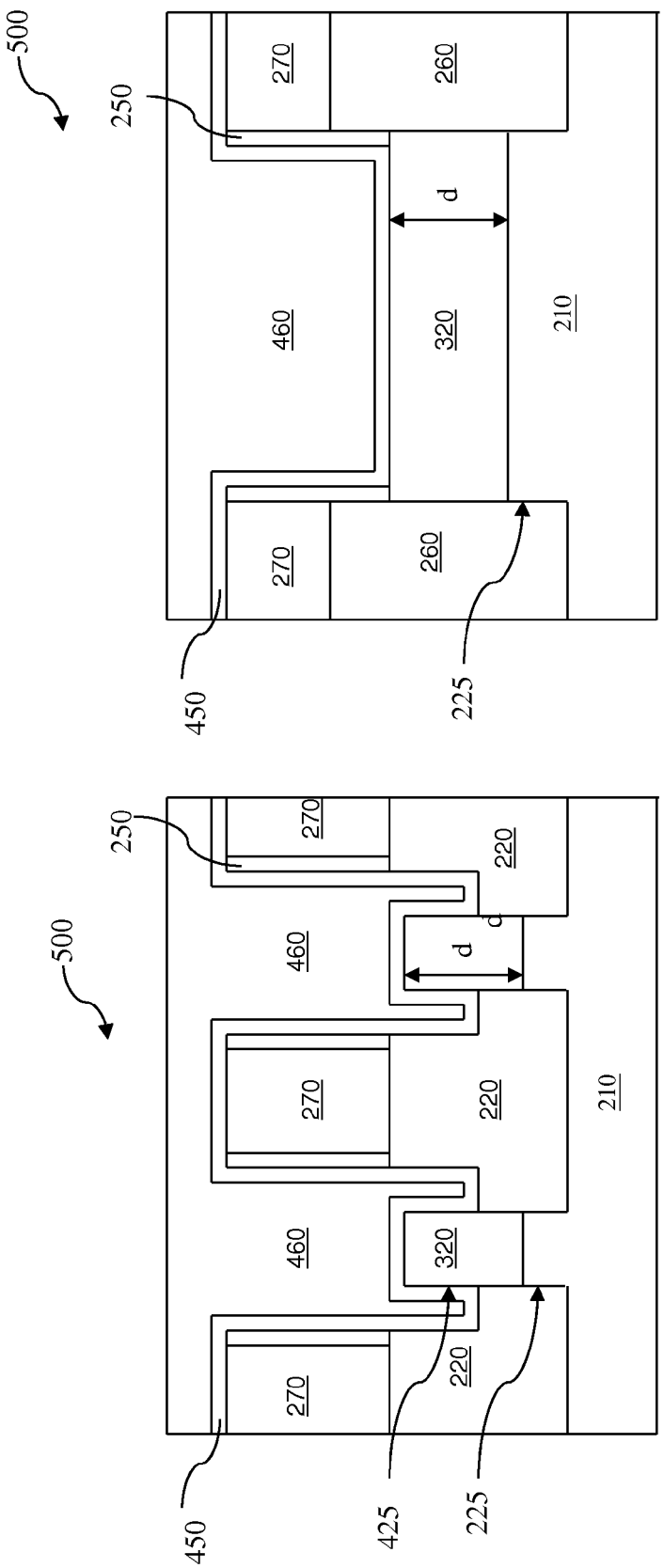

METHOD OF MAKING A FINFET DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. For example, high temperature processes of source/drain formation can adversely affect gate characteristics, and thus raise challenges in a FinFET process development. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 5A, 6A, 7A, 8A and 9A illustrate cross sectional views of a FinFET device along line A-A in FIG. 2.

FIGS. 4B, 5B, 6B, 7B, 8B and 9B illustrate cross sectional views of a FinFET device along line B-B in FIG. 2.

DETAILED DESCRIPTION

Figure 1:
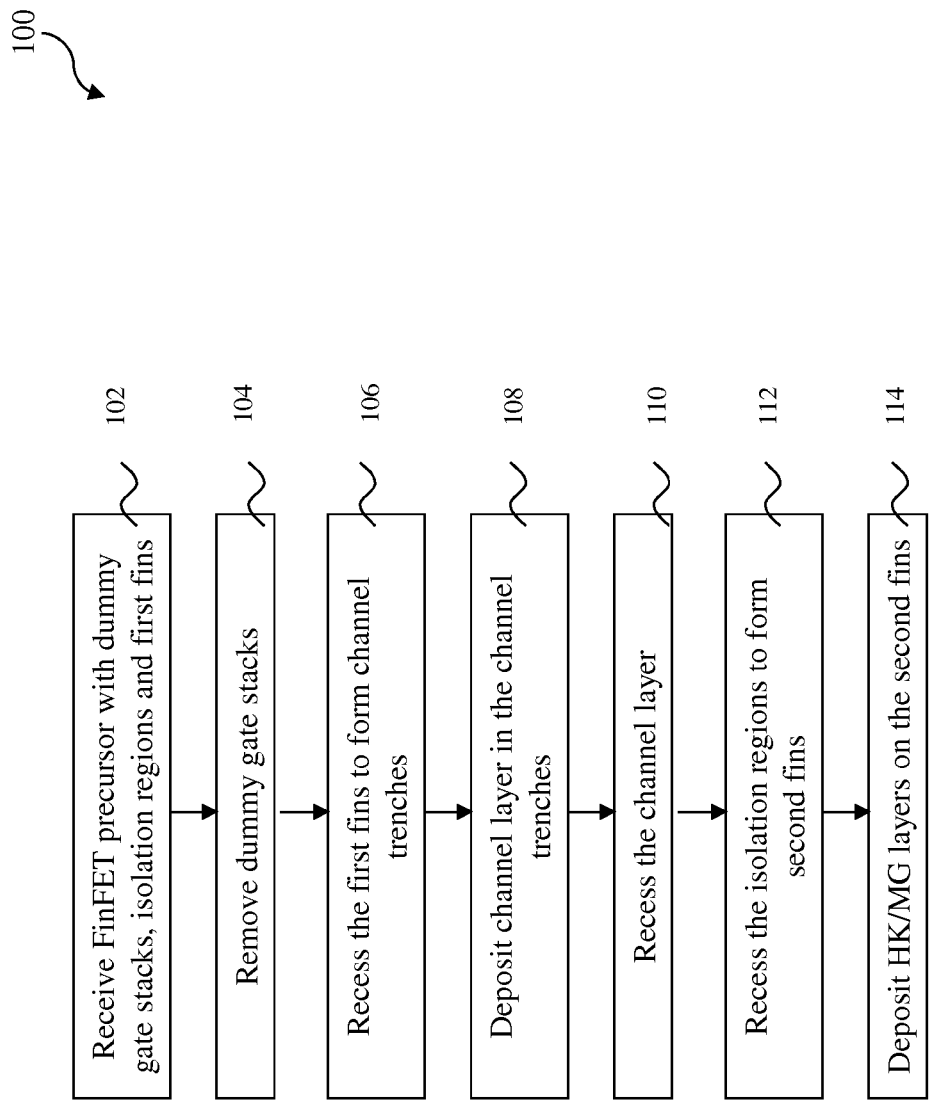
FIG. 1 is a flow chart of an example method for fabricating a FinFET device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Examples of devices that can benefit from one or more embodiments of the present application include FinFET devices. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present application. It is understood, however, that the application should not be limited to a particular type of device, except as specifically claimed.

Figure 2:
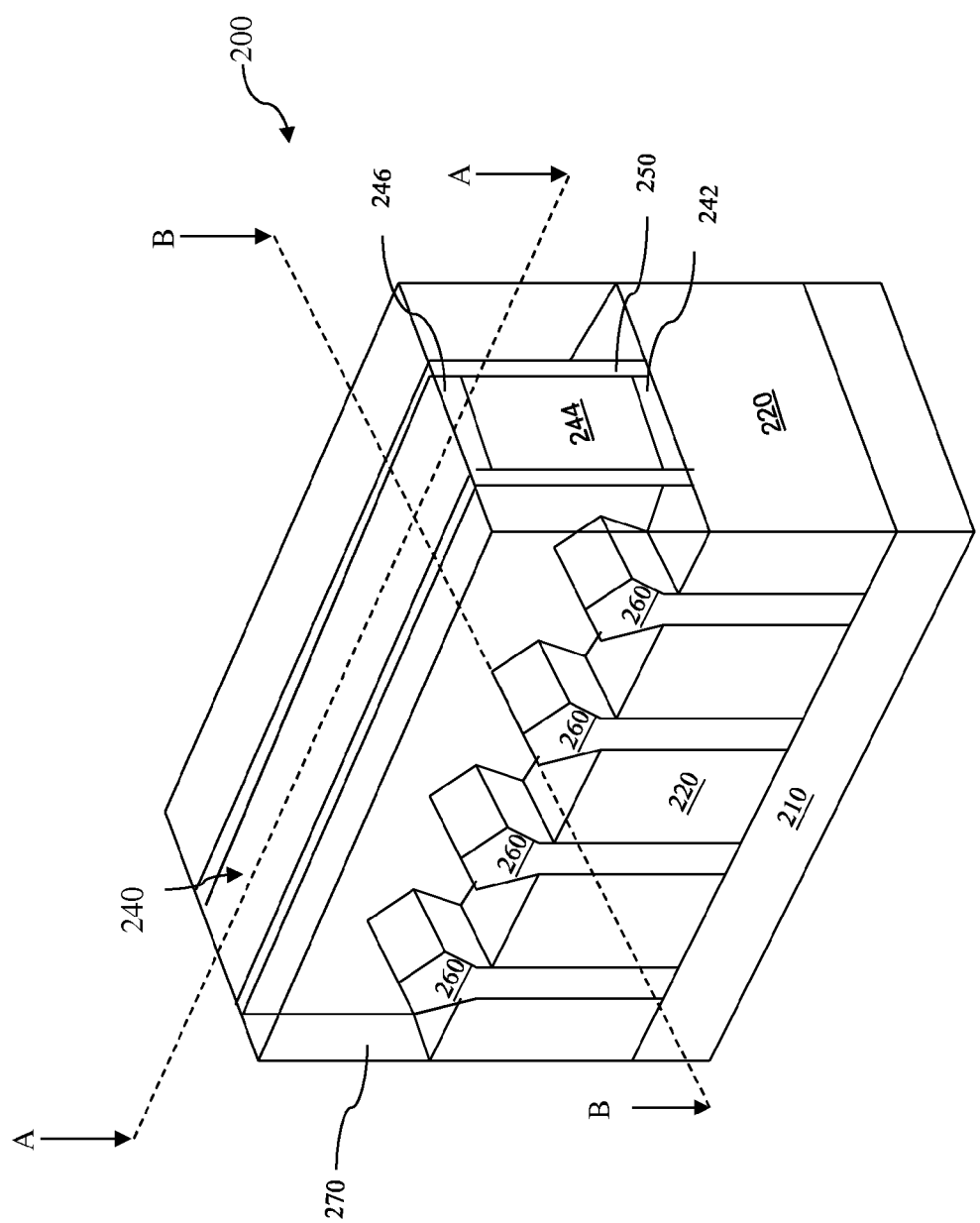
FIG. 2 is a top view of a FinFET precursor according to various aspects of the present disclosure.
Figure 3B:
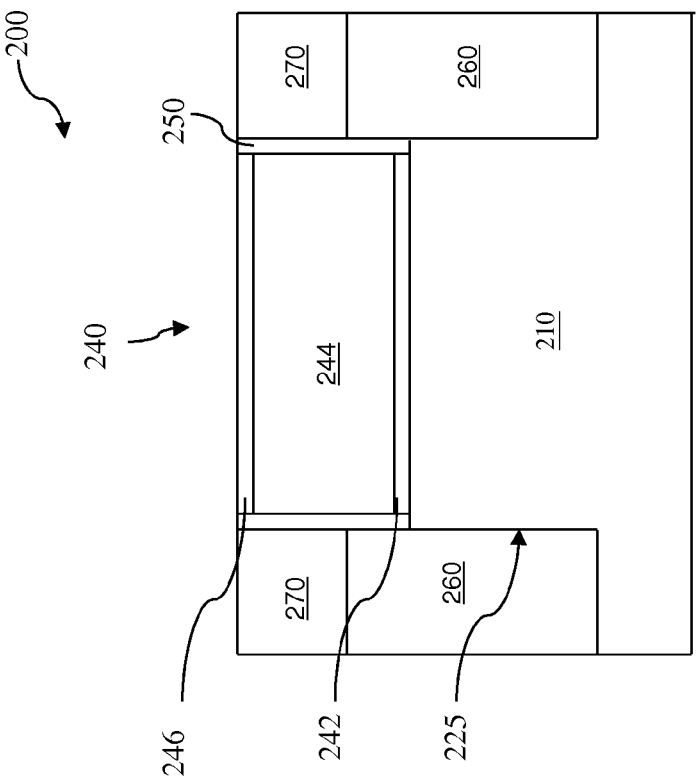
FIG. 3B illustrates cross sectional view of a FinFET precursor along line B-B in FIG. 2.
Figure 3A:
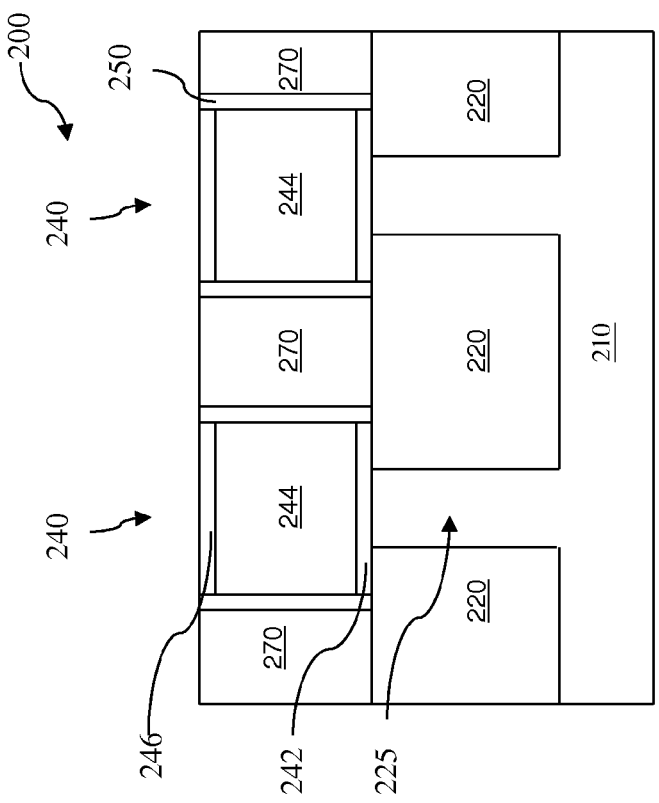
FIG. 3A illustrates a cross sectional view of a FinFET precursor along line A-A in FIG. 2.

FIG. 1 is a flowchart of a method 100 for fabricating a FinFET device according to aspects of the present disclosure. FIG. 2 is a side-perspective view of a precursor for the FinFET, labeled with the reference numeral 200, manufactured according to the method of FIG. 1. FIGS. 3A, 4A, 5A, 6A, 7A, 8A and 9A are cross section views along the line A-A of FIG. 2. FIGS. 3B, 4B, 5B, 6B, 7B, 8B and 9B are cross section views along the line B-B of FIG. 2 and perpendicular to the direction of the line of A-A. It is understood that additional steps can be provided before, during, and after the method, and some of the steps described can be replaced or eliminated for other embodiments of the method.

Referring to FIGS. 1-3B, the method 100 begins at step 102 by receiving the FinFET precursor 200. The FinFET precursor 200 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors 200, the insulator layer is a component (e.g., layer) of a silicon-on-insulator substrate.

The FinFET precursor 200 may also include various doped regions on the substrate 210. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The FinFET precursor 200 may also include isolation regions 220 formed on the substrate 210 to isolate active regions of the substrate 210. The isolation region 220 may be formed using traditional isolation technology, such as shallow trench isolation (STI), to define and electrically isolate the various regions. The isolation region 220 comprises silicon oxide, silicon nitride, silicon oxynitride, an air gap, other suitable materials, or combinations thereof. The isolation region 220 is formed by any suitable process. As one example, the formation of an STI includes a photolithography process, an etch process to etch a trench in the substrate 210 (for example, by using a dry etching and/or wet etching), and a deposition to fill in the trench (for example, by using a chemical vapor deposition process) with one or more dielectric materials. In some examples, the filled trench may have a multi-layer structure such as a thermal oxide liner layer filled with silicon nitride or silicon oxide. In the present embodiment, where the substrate 210 remaining between trenches forms first fins 225 and the first fins 225 are separated by the isolation regions 220.

In the present embodiment, the FinFET precursor 200 also includes one or more dummy gate stacks 240 formed over the substrate 210, including over a portion of the first fins 225. The dummy gate stacks 240 are to be replaced later by a high-k (HK) and metal gate (MG) after high thermal temperature processes are performed, such as thermal processes during sources/drains formation. The dummy gate stack 240 may include the dielectric layer 242, the polysilicon layer 244 and the hard mask 246. The dummy gate stack 240 is formed by any suitable process or processes. For example, the gate stack 240 can be formed by a procedure including deposition, photolithography patterning, and etching processes. The deposition processes include chemical vapor deposition (CVD), physical vapor deposition (PVD), atomic layer deposition (ALD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). The dielectric layer 242 includes silicon oxide, silicon nitride, or any other suitable materials. The hard mask 246 includes any suitable material, for example, silicon nitride, silicon oxynitride and silicon carbide.

The FinFET precursor 200 may also include sidewall spacers 250 formed along the dummy gate stacks 240. The sidewall spacers 250 may include a dielectric material such as silicon oxide, silicon nitride, silicon carbide, silicon oxynitride, or combinations thereof. Typical formation methods for the sidewall spacers 250 include depositing a dielectric material over the gate stack and then anisotropically etching back the dielectric material. The etching back process may include a multiple-step etching to gain etch selectivity, flexibility and desired overetch control.

The FinFET precursor 200 may also include source/drain features 260 formed on the substrate 210. The source/drain features 260 may be formed by recessing a portion of the substrate 210 to form source/drain recessing trenches and epitaxially growing a semiconductor material layer in the sources/drains recessing trenches. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The source/drain features 260 may be formed by one or more epitaxy or epitaxial (epi) processes. The source/drain features 260 may be in-situ doped during the epi process. For example, the epitaxially grown SiGe source/drain features 260 may be doped with boron; and the epitaxially grown Si epi source/drain features 260 may be doped with carbon to form Si:C source/drain features, phosphorous to form Si:P source/drain features, or both carbon and phosphorous to form SiCP source/drain features. In one embodiment, the source/drain features 260 are not in-situ doped, an implantation process (i.e., a junction implant process) is performed to dope the source/drain features 260. One or more annealing processes may be performed to activate source/drain epitaxial feature. The annealing processes comprise rapid thermal annealing (RTA) and/or laser annealing processes.

The FinFET precursor 200 may also an interlayer dielectric (ILD) layer 270 formed between the dummy gate stacks 240 on the substrate 210. The ILD layer 270 includes silicon oxide, oxynitride or other suitable materials. The ILD layer 270 includes a single layer or multiple layers. The ILD layer 270 is formed by a suitable technique, such as CVD, ALD and spin-on (SOG). A chemical mechanical polishing (CMP) process may be performed to remove excessive ILD layer 270 and planarize the top surface of the ILD layer 270 with the top surface of the dummy gate stacks 240.

Referring to FIGS. 1 and 4A-4B, once the FinFET precursor 200 is received, the method 100 proceeds to step 104 by removing the dummy gate stacks 240 to expose the top surface of the first fins 255 to form a gate trench 305. The dummy gate stacks 240 may be removed by lithography patterning and etch processes. Alternatively, the dummy gate stacks 240 may be removed by a selective wet etch or a selective dry etch, such that having an adequate etch selectivity with respect to dielectric layers (the isolation regions 220, sidewall spacers 250 and the ILD layer 270).

Referring to FIGS. 1 and 5A-5B, the method 100 proceeds to step 106 by recessing the first fins 255 in the gate trench 305 to form a channel trench 310. It is noted that the following discussion will now refer to the FinFET precursor 200 as a FinFET device 500. The recessing process may also include a selective wet etch or a selective dry etch. For example, the wet etching solution may include a tetramethylammonium hydroxide (TMAH), a HF/HNO3/CH3COOH solution, or other suitable solution. For another example, the dry etching processes may include a biased plasma etching process that uses a chlorine-based chemistry.

Referring to FIGS. 1 and 6A-6B, the method 100 proceeds to step 108 by depositing a channel layer 320 in the channel trenches 310. The channel layer 320 includes Ge, Si, GaAs, SiGe, GaAsP, or any other suitable semiconductor materials. The channel layer 320 may be deposited by epitaxial processes, such as VPE, molecular beam epitaxy, a selective epitaxial process, and/or other suitable processes. In one embodiment, prior to depositing the channel layer 320, a back-diffusion barrier layer is deposited in the channel trenches 310 first. The back-diffusion barrier layer includes semiconductor materials such as SiC and SiGe, or any other suitable semiconductor materials of Group IV and Group III-IV. In another embodiment, the back-diffusion barrier layer is deposited by an in-situ doped epitaxial process.

Figure 7B:
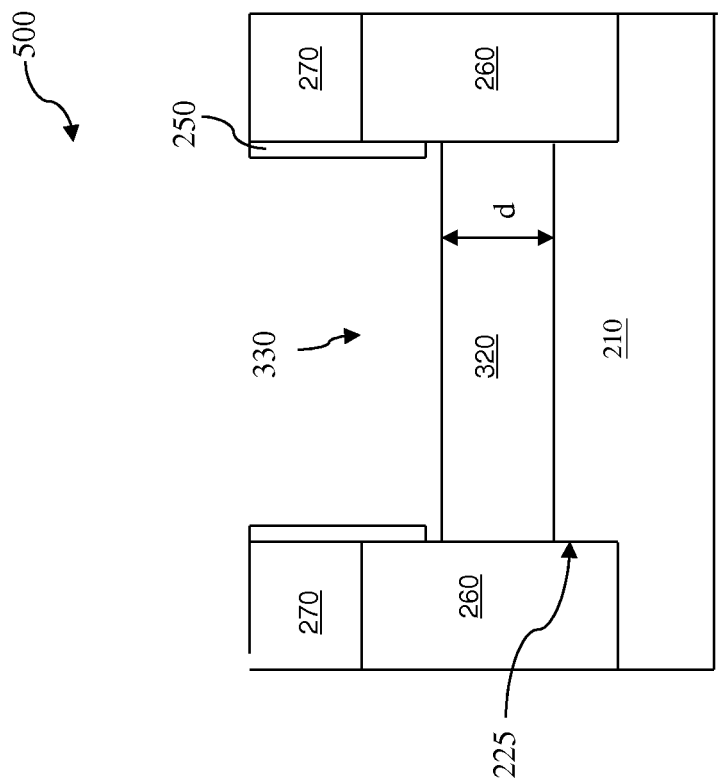
Figure 7A:
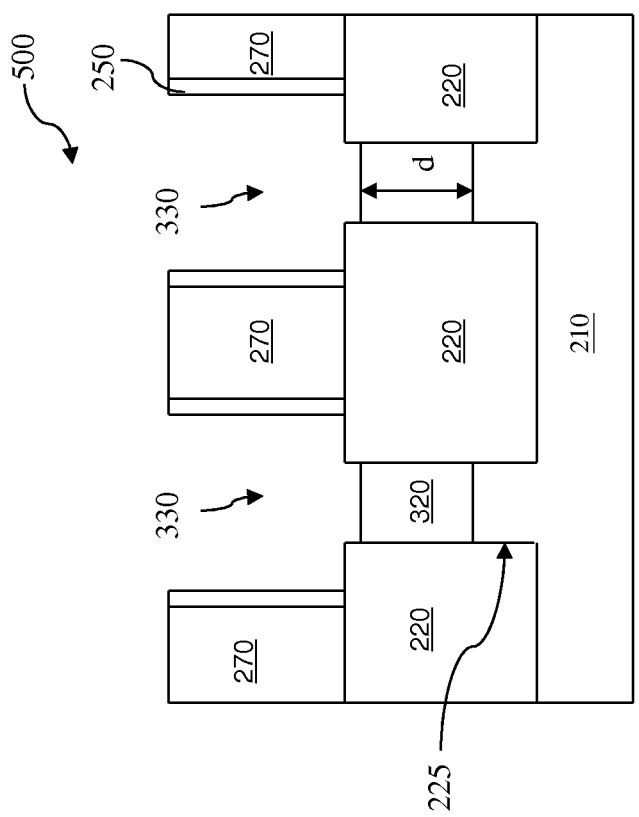

Referring to FIGS. 1 and 7A-7B, the method 100 proceeds to step 110 by recessing the channel layer 320 to expose the top surface of the isolation regions 220. The channel layer 320 may be recessed by a series of processes including photolithography patterning and etching back. Alternatively, the channel layer 320 may be etched back by a selective wet etch or a selective dry etch, such that having an adequate etch selectivity with respect to the isolation regions 220. The recessed channel layer 320 has a predetermined depth (d), which may be controlled by etch back process.

Figure 8B:
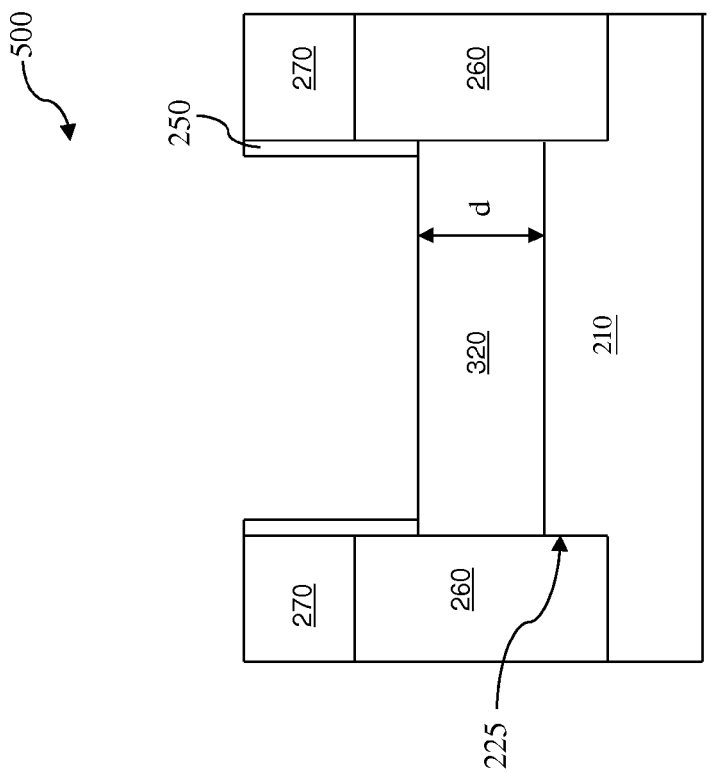
Figure 8A:
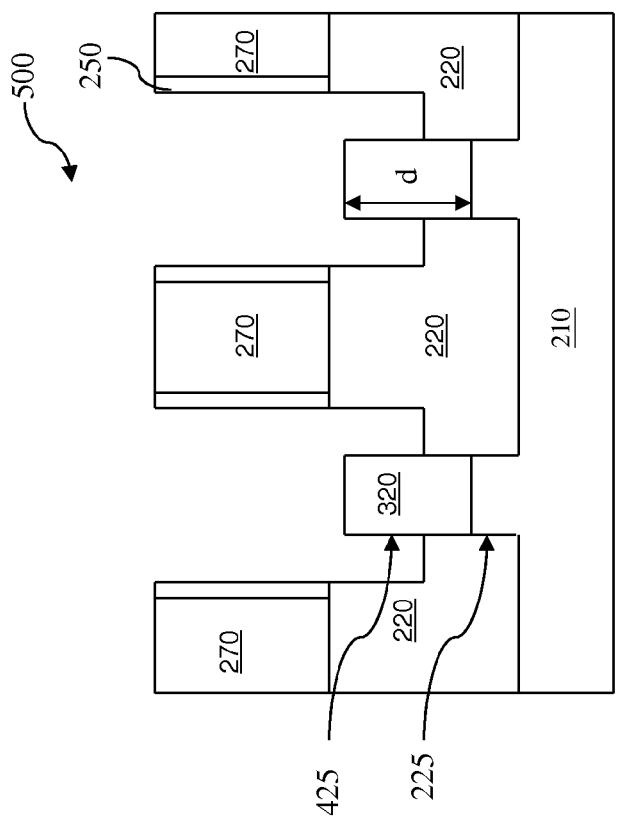

Referring to FIGS. 1 and 8A-8B, the method 100 proceeds to step 112 by recessing the isolation regions 220 to laterally expose at least a portion of the recessed channel layer 320 to form second fins 425. The recessing process may include selective wet etch or selective dry etch, such that having an adequate etch selectivity with respect to the channel layer 320. Alternatively, the isolation regions 220 may be recessed by a series of processes including photolithography patterning and etching back.

Referring to FIGS. 1 and 9A-9B, the method 100 proceeds to step 114 by depositing a gate dielectric layer 450 and metal gate 460 over the substrate 210, including wrapping over a portion of the second fins 425, where the second fins 425 serve as channel regions. In the present embodiment, the second fins 425 (the channel regions) are formed after sources/drains thermal processes being performed. The gate dielectric layer 450 may include an interfacial layer (IL) deposited by any appropriate method, such as atomic layer deposition (ALD), chemical vapor deposition CVD and ozone oxidation. The IL includes oxide, HfSiO and oxynitride. The gate dielectric layer 450 may also include a high-k (HK) dielectric layer deposited on the IL by suitable techniques, such as ALD, CVD, metalorganic CVD (MOCVD), physical vapor deposition (PVD), thermal oxidation, combinations thereof, or other suitable techniques. The HK dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr) TiO3 (BST), Al2O3, Si3N4, oxynitrides (SiON), or other suitable materials.

The MG layer 460 may include a single layer or multi layers, such as metal layer, liner layer, wetting layer, and adhesion layer. The MG layer 460 may include Ti, Ag, Al, TiAlN, TaC, TaCN, TaSiN, Mn, Zr, TiN, TaN, Ru, Mo, Al, WN, Cu, W, or any suitable materials. The MG layer 460 may be formed by ALD, PVD, CVD, or other suitable process. A CMP may be performed to remove excessive MG layer 460. The CMP process may have a high selectivity of metal layers selectivity with respect to the ILD layer 270. The CMP provides a substantially planar top surface for the metal gate layer 460 and the ILD layer 270.

Additional steps can be provided before, during, and after the method 100, and some of the steps described can be replaced, eliminated, or moved around for additional embodiments of the method 100.

The FinFET device 500 may include additional features, which may be formed by subsequent processing. For example, various contacts/vias/lines and multilayer interconnect features (e.g., metal layers and interlayer dielectrics) may be formed over the substrate, configured to connect the various features or structures of the devices 500. For example, a multilayer interconnection includes vertical interconnects, such as conventional vias or contacts, and horizontal interconnects, such as metal lines. The various interconnection features may implement various conductive materials including copper, tungsten, and/or silicide.

Based on the above, it can be seen that the present disclosure offers methods for fabricating a FinFET device. The method employs a channel region (second fins) last process scheme to avoid dopant related activation thermal processes after the channel region formation. The method demonstrates reducing random dopant fluctuation (RDF). The method offers a locally selective epitaxial growth the channel region (the second fins) to gain channel mobility. The method also provides process flexibility to employ an embedded back-diffusion barrier layer formation beneath the channel region and perform a channel region ion-implantation (IMP) with a self-IMP-mask nature.

The present disclosure provides many different embodiments of fabricating a FinFET device that provide one or more improvements over existing approaches. In one embodiment, a method for fabricating a FinFET device includes receiving a FinFET precursor. The FinFET precursor includes a substrate, first fins on the substrate, isolation regions on sides of the first fins, source/drain features on the substrate and dummy gate stacks separating the source/drain features on the substrate. The method also includes removing the dummy gate stack to expose the first fins, recessing the first fins to form channel trenches, depositing a channel layer in the channel trenches, recessing the channel layer to a predetermined depth (d), recessing the isolation regions to laterally expose at least a portion of the recessed channel layer to form second fins and depositing a high-k (HK) dielectric layer and a metal gate (MG) layer on the second fins.

In another embodiment, a method for fabricating a FinFET device includes receiving a FinFET precursor. The FinFET precursor includes a silicon substrate, first silicon fins formed by a portion of the silicon substrate, isolation regions on sides of the first fins, source/drain features on the silicon substrate and dummy gate stacks separating the source/drain features on the substrate. The method also includes removing the dummy gate stack to form gate trenches, recessing the first fins in the gate trenches to form channel trenches, epitaxially growing a channel layer to fill in the channel trenches, recessing the channel layer to a predetermined depth (d), recessing the isolation regions to laterally expose at least a portion of the channel layer in the gate trenches to form second fins and depositing a high-k (HK) dielectric layer and a metal gate (MG) layer on the second fins.

In yet another embodiment, a method for fabricating a FinFET device includes receiving a FinFET precursor. The FinFET precursor includes a substrate, first fins formed by a portion of the substrate, isolation regions on sides of the first fins, source/drain features on the silicon substrate and dummy gate stacks separating the source/drain features on the substrate. The method also includes removing the dummy gate stack to expose the first fins, recessing the first fins to form channel trenches, depositing a back-diffusion barrier layer, formed by one or more semiconductor materials from the group consisting of Group V and Group III-V, on the channel trenches, epitaxially growing a channel layer on the back-diffusion barrier layer, recessing the channel layer to a predetermined depth (d), then recessing the isolation regions to laterally expose at least a portion of the recessed channel layer to form second fins and depositing a high-k (HK) dielectric layer and a metal gate (MG) layer on the second fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a fin-type field-effect transistor (FinFET) device, the method comprising:

receiving a FinFET precursor, the FinFET precursor
including:
a substrate;
first fins on the substrate;
isolation regions on sides of the first fins;
source/drain features on the substrate; and
dummy gate stacks separating the source/drain features on the substrate;
removing the dummy gate stacks to expose the first fins;
recessing the first fins to form channel trenches;
depositing a channel layer in the channel trenches;
recessing the channel layer to a predetermined depth (d);
recessing the isolation regions to laterally expose at least a portion of the recessed channel layer for second fins; and
depositing a high-k (HK) dielectric layer and a metal gate (MG) layer on the second fins.

2. The method of claim 1, wherein the channel layer includes one or more semiconductor materials from the group consisting of germanium, silicon germanium and Group III-V.

3. The method of claim 1, wherein the channel layer is deposited by an epitaxial growth technique.

4. The method of claim 3, wherein the channel layer is deposited by a selective epitaxial growth technique.

5. The method of claim 3, wherein the isolation regions are recessed to laterally expose at least a portion of the epitaxial growth channel layer to from the second fins to serve as the channel region.

6. The method of claim 1, wherein the second fins as the channel regions are formed after source/drain thermal processes.

7. The method of claim 1, wherein the depth (d) of the channel region is controlled by the channel layer recessing process.

8. The method of claim 1, further comprising:
prior to the channel layer deposition, depositing a back-diffusion layer beneath the channel layer.

9. The method of claim 8, wherein the back-diffusion barrier layer includes one or more semiconductor materials from the group consisting of Group IV and Group III-V.

10. The method of claim 1, the FinFET precursor further comprising:
sidewall spacers formed along sidewalls of the dummy gate stacks; and
an interlayer dielectric (ILD) layer deposited between the dummy gate stacks and on sides of the sidewall spacers.

11. The method of claim 10, wherein after removing the dummy gate stacks, the sidewall spacers and the dielectric layer form an upper portion of sidewalls of the gate trenches.

12. The method of claim 11, wherein the upper portion of sidewalls of the gate trench serves as a mask of an ion-implantation (IMP) performed on the channel region.

13. A method for fabricating a fin-type field-effect transistor (FinFET) device, the method comprising:
receiving a FinFET precursor, the FinFET precursor including:
a silicon substrate;
first silicon fins formed by a portion of the silicon substrate;
isolation regions on sides of the first fins;
source/drain features on the silicon substrate; and
dummy gate stacks separating the source/drain features on the substrate;
removing the dummy gate stacks to form gate trenches;
recessing the first fins in the gate trenches to form channel trenches;
epitaxially growing a channel layer to fill in the channel trenches;
recessing the channel layer to a predetermined depth (d);
recessing the isolation regions to laterally expose at least a portion of the channel layer in the gate trenches to form second fins; and
depositing a high-k (HK) dielectric layer and a metal gate (MG) layer on the second fins.

14. The method of claim 13, wherein the second fins formed by epitaxial growth include one or more semiconductor materials from the group consisting of Group V and Group III-V.

15. The method of claim 13, wherein the height of the second fins is defined by the depth (d) of the recessed channel layer.

16. The method of claim 13, wherein the second fins are formed after source/drain thermal processes.

17. The method of claim 13, further comprising:
prior to the channel layer deposition, depositing a back-diffusion barrier layer on the channel trenches.

18. The method of claim 13, further comprising:
after recessing the channel layer, performing an ion-implantation on the recessed channel layer.

19. A method for fabricating a fin field-effect transistor (FinFET) device, the method comprising:
receiving a FinFET precursor, the FinFET precursor including:
a silicon substrate;
first silicon fins formed by a portion of the silicon substrate;
isolation regions on sides of the first fins;
source/drain features on the silicon substrate; and
dummy gate stacks separating the source/drain features on the substrate;
removing the dummy gate stacks to expose the first fins;
recessing the first fins to form channel trenches;
depositing a back-diffusion barrier layer, formed by one or more semiconductor materials from the group consisting of Group V and Group III-V, on the channel trenches;
epitaxially growing a channel layer on the back-diffusion barrier layer;
recessing the channel layer to a predetermined depth (d);
recessing the isolation regions to laterally expose at least a portion of the recessed channel layer to form second fins; and
depositing a high-k (HK) dielectric layer and a metal gate (MG) layer on the second fins.

20. The method of claim 19, wherein the second fins are formed after source and drain thermal processes.

* * * * *